United States Patent
Lehavot

Patent Number: 5,825,217
Date of Patent: Oct. 20, 1998

[54] LOW POWER ACCELERATED SWITCHING FOR MOS CIRCUITS

[75] Inventor: Amir Lehavot, 2346 Sutter apt. #12, Santa Clara, Calif. 95050

[73] Assignee: Amir Lehavot, Santa Clara, Calif.

[21] Appl. No.: 861,173

[22] Filed: May 21, 1997

Related U.S. Application Data

[60] Provisional application No. 60/018,564 May 29, 1996.

[51] Int. Cl.⁶ ..................................................... H03B 1/00
[52] U.S. Cl. ............................ 327/111; 327/112; 327/374; 327/382
[58] Field of Search ..................................... 327/108, 109, 327/110, 111, 112, 374, 376, 377, 382, 389, 391, 423, 424, 427

Primary Examiner—Timothy P. Callahan
Assistant Examiner—Jeffrey Zweizig

[57] ABSTRACT

A design method using a device with a capacitance inserted in between the output of a MOS circuit and it's corresponding load. This creates a smaller equivalence capacitance to be seen by the MOS circuit. This in turn creates faster switching times and lower power dissipation. Careful design of the circuits which have the capacitor that was added in their input stage is necessary since the high voltage level that these circuits will see is now modified due to the voltage divider created by the added capacitor and the load capacitance. With careful optimization of all parameters involved, circuits could achieve superior switching speed or superior power performance or both compared to other circuits of the same size that do not use this technique.

13 Claims, 2 Drawing Sheets

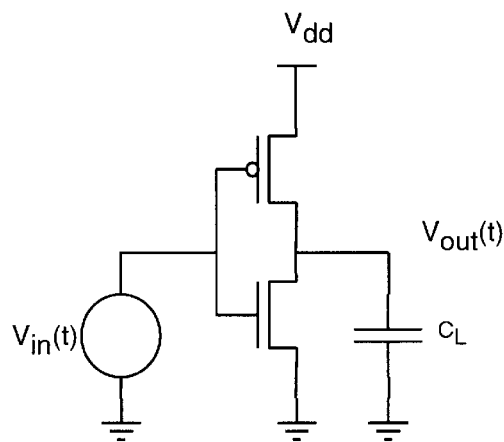
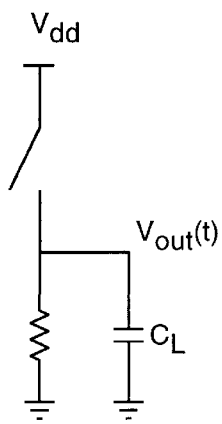
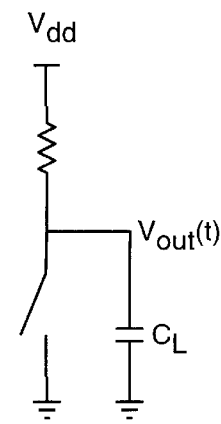
Fig. 1.   Fig. 2.   Fig. 3.
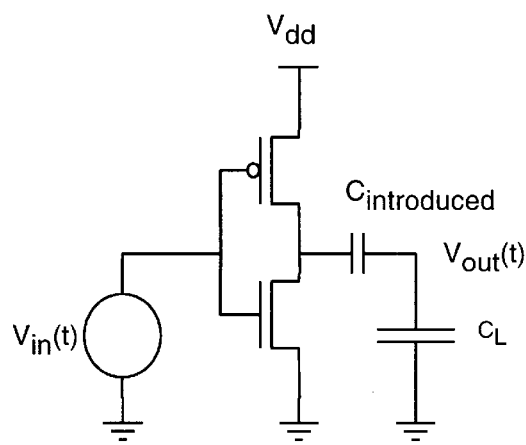
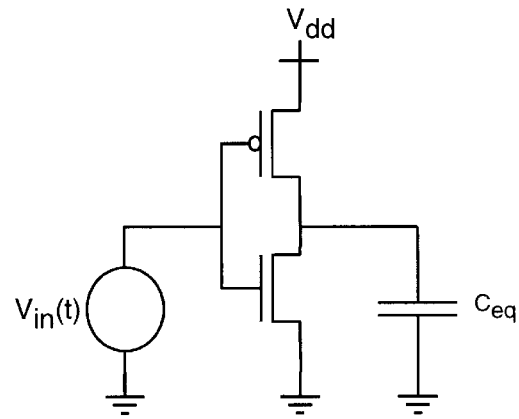
Fig. 4.   Fig. 5.

LOW POWER ACCELERATED SWITCHING FOR MOS CIRCUITS

The present application claims priority of Provisional Application 60/018,564, filed May 29, 1996.

BACKGROUND-FIELD OF INVENTION

This invention relates to design methods for MOS (Metal Oxide Silicon) circuits.

BACKGROUND-DISCUSSION OF PRIOR ART

FIG. 1 shows a CMOS (Complementrary Metal Oxide Silicon) inverter with a capacitive load, $C_L$, that represents the load capacitance (input of next gates, output of this gate and routing). The switching speed of a CMOS gate is limited by the time taken to charge and discharge the load capacitance, $C_L$. An input transition results in an output transition that either charges $C_L$ toward $V_{dd}$ (supply voltage) or discharges $C_L$ toward ground.

The fall and rise time of this circuit could be roughly estimated by modeling the MOS transistors as resistors, as shown in FIGS. 2 and 3. FIG. 2 models the inverter having it's input voltage driven to high (supply voltage, $V_{dd}$ in the figure); in this model the NMOS transistor is modeled as a resistor while the PMOS transistor is modeled as an open circuit. FIG. 3 models the inverter having it's input voltage driven to low (ground); in this model the PMOS transistor is modeled as a resistor while the NMOS transistor is modeled as an open circuit. Traditionally, in order to make the circuit faster, designers will increase the width of the transistor, effectively reducing the equivalent on resistance of the gate and thereby improving the switching speed. The disadvantages of this method include:

(a) Increased circuit size due to the larger width of the transistor. The area of the transistor will increase by the same factor the width has been increased. There is a direct tradeoff between the switching speed and the area of the transistor.

(b) increased power dissipation in the circuit due to the reduced on resistance of the gate which leads to greater currents. There is a direct tradeoff between the switching speed and the power dissipation. The switching speed is improved by increasing the current that charges or discharges $C_L$. However, this increased current causes a direct increase in the power dissipation.

(c) Increased input capacitance of the circuit due to the larger transistor width. This will cause the capacitive load seen by the circuit that loads this one to increase. There is a direct tradeoff between the switching speed and the input capacitance of the circuit.

OBJECTS AND ADVANTAGES

Accordingly, several objects and advantages of my invention are:

(a) The increase in the circuit size is very small compared to other methods.

(b) Power dissipation of the circuit is decreased.

(c) The input capacitance of the circuit remains the same.

Further objects and advantages will become apparent from a consideration of the ensuring description and drawings.

DRAWING FIGURES

FIG. 1 shows a CMOS inverter with a capacitive load that represents the load capacitance (input of next gates, output of this gate and routing).

FIG. 2 shows a model of a CMOS inverter when driven by a high voltage. The NMOS transistor is modeled as a resistor while the PMOS transistor is modeled as an open circuit.

FIG. 3 shows a model of a CMOS inverter when driven by a low voltage. The PMOS transistor is modeled as a resistor while the NMOS transistor is modeled as an open circuit.

FIG. 4 shows a CMOS inverter with a capacitive load that has been modified by adding a capacitor to it's output in series with the load capacitance. This capacitor could be implemented by any device that has a capacitance; the capacitor in the drawing is only modeling whatever device is used.

FIG. 5 shows a model of a CMOS inverter with a capacitive load that has been modified by adding a capacitor to it's output in series with the load capacitance. The figure shows that the load as seen by the inverter is a capacitance that is equal to the added capacitance and the original load capacitance in series.

SUMMARY

A design method for metal oxide silicon circuits, comprising: providing a metal oxide silicon circuit with a capacitive load, providing a device with a capacitance, inserting said device in series in between the output of said metal oxide silicon circuit and said capacitive load, whereby said metal oxide silicon circuit will operate faster or will dissipate less power or both compared to other metal oxide silicon circuits of the same size.

Description

Figure 6:
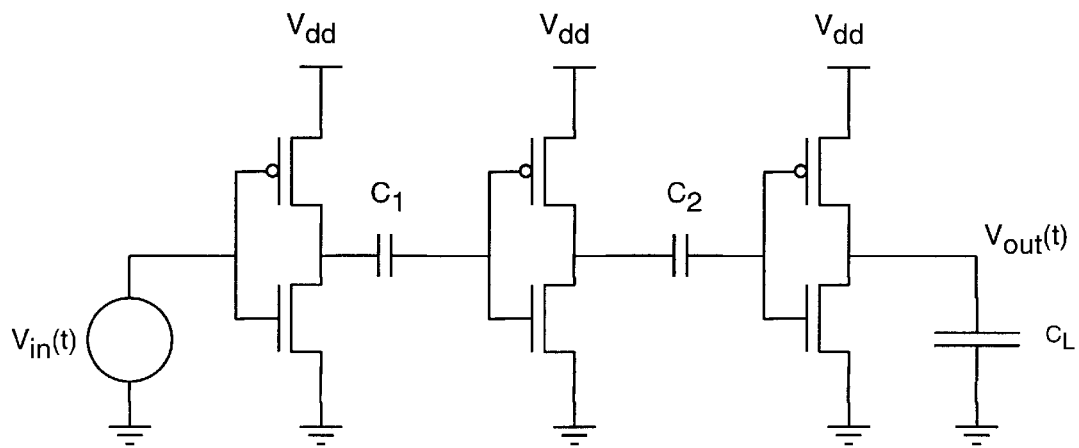
FIG. 6 shows a CMOS circuit consisting of three CMOS inverters that has been modified by introducing capacitors at the output of the first two inverters. The capacitors that were introduced are in series with the inputs of the inverters they drive.

The basic idea behind this patent is to use a capacitor (or any other device with a capacitance) in series with the load capacitance (a capacitor between the output of the MOS circuit and the load capacitance) driven by a MOS circuit, see FIG. 4. Assuming that the load capacitance $C_L$ is due mostly to the input capacitance of the next gates, the capacitance seen now by the circuit is $C_{eq}$ (equivalent capacitance seen by the circuit)=$(1/C_L+1/C_{introduced})^{-1}$. $C_{introduced}$ is the capacitance introduced to the circuit between the output of the circuit and $C_L$. This will effectively reduce the load capacitance seen by the MOS circuit, see FIG. 5. FIG. 6 shows how an entire CMOS system might look when this design method is applied. This system consists of three inverters in series driving a capacitive load. $C_1$ and $C_2$ are the capacitors that were introduced to the system in order to reduce the equivalent capacitive load seen by the inverters driving them, inverters 1 and 2 respectively. $C_L$, the load capacitance is not shown between the inverters in this figure since $C_L$ is a parasitic capacitance, it only represents the capacitance seen by the circuit due to the loading of the transistors it drives. The capacitive load which is not shown in the figure is there due to the parasitic capacitance of the transistors. For example, the load seen by inverter 1 is $C_1$ in series with the load capacitance that inverter 2 presents (This capacitance is also in parallel with load capacitance that is there due to the output of inverter 1 and routing; it is assumed this capacitance is relatively small and insignificant).

The advantages of this design method compared to simply increasing the width of the transistor are:

(a) The increase in the size of the circuit is very small (only a capacitor needs to be added).

(b) Power dissipation is decreased due to the lower currents needed to charge $C_{eq}$, the equivalent capacitance seen by the circuit.

(c) The input capacitance of this circuit and load capacitance seen by the circuit loading this one remains the same (In FIG. 6, the circuit that loads inverter 1 sees the same load capacitance as it would have seen when $C_1$ and $C_2$ were not there).

The tradeoff with this design method is that when the output is rising it will not rise all the way to $V_{dd}$ (the supply voltage), see FIG. 4. Due to the voltage division between the two capacitors $C_{introduced}$ and $C_L$ the output voltage will only rise to $V_{out}=V_{dd}*C_{introduced}/(C_{introduced}+C_L)$. This will cause the circuit being loaded by this one to operate slower (due to the lower gate voltage that drives it now) and can also cause some noise margin problems. Although the switching speed is reduced by this effect, it is improved by the reduced equivalent capacitance seen by the circuit. Which one of these effects will dominate will depend on the parameters of the circuit and will be described in more detail under operation. With careful design the advantages of this design method will outweigh the disadvantages by far.

Operation

To illustrate further the operation of a circuit using this design technique a design using $C_{introduced}=C_L$ is analyzed. For this example assume a CMOS inverter driving a capacitive load, $C_L$. Although in this example a CMOS circuit is used, this design method could apply to other MOS circuits (BiCMOS, Pseudo-nMOS and any other circuits that use MOS transistors as part of their building blocks; Pseudo n MOS refers to a known design method where a grounded PMOS transistor is used for the P side of the circuit).

The most appropriate value for $C_{introduced}$ will depend on the application it is used in and the specific circuit it is used in. In the case where $C_{introduced}=C_L$ the equivalent capacitance seen by the circuit $C_{eq}$ will equal $0.5*C_L$.

Figure 7:
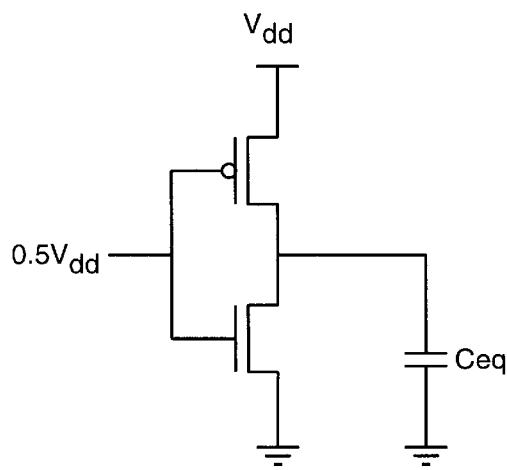
FIG. 7 shows a CMOS inverter that is driven by an input voltage that is half ways in between ground and the supply voltage.
Figure 8:
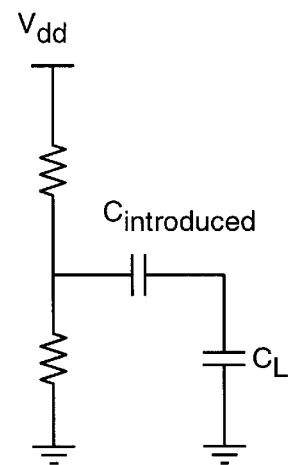
FIG. 8 shows a model of a CMOS inverter that is driven by an input voltage that is half ways in between ground and the supply voltage; this inverter also has a capacitor added in between it's output and load capacitance. Both MOS transistors in the figure are modeled as resistors.

This has the immediate effect of improving fall and rise time by a factor of 2. Power dissipation is also improved since the lower capacitance needs less current to charge or discharge. However, $V_{OUT}$ (the output voltage) will only rise to $0.5V_{dd}$, see FIG. 7. In order for the system to work correctly now, the circuit driven by this circuit must be designed so that it recognizes $0.5V_{dd}$ as high; assuming an inverter is driven by this circuit it's output should go low. By making the NMOS of that inverter stronger than the PMOS (larger width, smaller equivalent resistance) the output will go low as expected. As can be seen in FIG. 8, the output will not go all the way down to ground. FIG. 8 models a CMOS inverter with it's input voltage being driven to $^{0.5}V_{dd}$, both MOS transistors are modeled as resistors since they are both effectively turned on. How far down the output voltage down will depend on how much stronger the NMOS is compared to the PMOS and the ratio of $C_{introduced}$ to $C_L$. The fact that $V_{in}$ is only $0.5V_{dd}$ also causes problems in the switching speed (since the driving voltage is only one half of the power supply voltage, and the PMOS is also on and is effectively trying to charge $C_L$) and power (since there is now a direct path from ground to the power supply).

In order to minimize the negative effects of this design technique it is necessary to make the NMOS transistor stronger than the PMOS transistor, how much stronger will depend on many parameters: $C_{introduced}$, $C_L$, desired switching speed, noise margins, power considerations and other design parameters. By making the NMOS strong enough compared to the PMOS the power and noise margin disadvantages associated with the design can be reduced. Also, since there is some static power consideration with this design due to the direct path between the power supply and ground (the % of static power dissipation as compared to the total power dissipation could be reduced by designing the NMOS to be much stronger than the PMOS), the fall time should be designed so that it is as close to the clock frequency as possible. This will reduce the time the circuit is static, and therefor the % of static power dissipation compared to total power dissipation.

How much slower will the circuit be due to the driving voltage of only $0.5V_{dd}$ as opposed to $V_{dd}$ will depend on many variables including: relative strength of the NMOS and PMOS, power supply voltages and threshold voltages. Analysis of how much slower this circuit is shows that by making the NMOS significantly stronger than the PMOS it is possible to make the circuit only 3 times slower than a circuit being driven by $V_{dd}$ (only the fall time is 3 times slower). This analysis was done for $V_{dd}=5V$ and threshold voltage=0.9V. It was verified using Pspice (software program available at The University of Texas at Austin), however it is likely that by changing the relative strength of the NMOS, power supply voltages and threshold voltages an even faster circuit could be achieved.

The total effects of this design technique in this example are:

(a) Increased speed of rise time by a factor of 2. This is due to the fact that the equivalent capacitance seen by the circuit now is equal to $0.5*C_L$.

(b) Decreased speed of the fall time by a factor of 1.5. Since the fall time is 3 times slower due to the input voltage only rising to one half the power supply voltage and is faster by a factor of 2 due the equivalent capacitance seen by the circuit being $0.5*C_L$.

(c) Power dissipation is greatly reduced due to the lower equivalent capacitance seen by the circuit and the lower currents for the fall time due to the input voltage being only one half the power supply voltage.

Although, for this example only the power dissipation was significantly improved, in general with careful design the switching speed could also be improved. This example should convince the reader that this design technique is extremely useful; by simply choosing $C_{introduced}=C_L$, and without maximum optimization of the circuit parameters improvements were achieved. With maximum optimization of $C_{introduced}$ (this is the most important parameter that should be optimized for the specific circuit; it controls how far the output will rise and what kind of switching speed and power dissipation benefits would be realized) and other circuit parameters even better results could be achieved.

Summary, Ramifications, and Scope

This design technique (the addition of a capacitor in series between the output of a circuit and the load capacitance seen by it, in order to reduce the equivalent capacitance seen by the circuit) is unique in it's characteristics of improving both power dissipation and switching speed. This design technique is very general and could be used in many circuits. When one is trying to improve circuit performance using this method, careful design is necessary in order to realize optimal benefits. It will be important to vary many parameters and analyze the circuit behavior in order to realize maximum benefits. Important parameters that should be varied include:

(a) $C_{introduced}$, the value of $C_{introduced}$ compared to $C_L$ is very important; it determines how far the output voltage will rise, and by what factor will the switching speed and power dissipation improve.

(b) The relative strength of the NMOS compared to the PMOS; this will greatly affect the circuit performance. Increasing the size of the NMOS will also increase $C_L$ for the circuit loading this one, so careful design is needed.

(c) Supply voltage and threshold voltage; optimization of these parameters will improve the switching speed.

The actual hardware implementation of $C_{introduced}$ could be done in any way the designer chooses to use, often a MOS transistor appropriately biased will be used as a capacitor, however other implementations are also possible. Any device with a capacitance could be used for the purpose of inserting a capacitance in between the output of the circuit and it's load.

This design technique is not limited to CMOS circuits; it could be applied to any MOS circuit (any circuit that has a MOS transistor driving a load).

Although throughout this paper an inverter was used as the example for the circuit, much larger systems could be represented by an inverter. Therefor this design technique is very general and applies to many circuits. This design technique is not limited to designers trying to improve switching speed and power dissipation; for example a circuit where the switching speed is of no importance and only the power is important could be improved by using this technique as well. The capacitor added will cause the driving voltage to be less than the power supply voltage and therefor the currents in the circuit will be reduced.

This design technique is extremely useful for custom designers trying to achieve faster low power circuits. By using this technique circuits could achieve superior switching speed or superior power performance or both compared to other circuits of the same size that do not use this technique.

I claim:

1. A design method for metal oxide silicon circuits, comprising:

(a) providing a metal oxide silicon circuit with a capacitive load, (b) providing a device with a capacitance, (c) inserting said device in series in between the output of said metal oxide silicon circuit and said capacitive load, whereby said metal oxide silicon circuit will operate faster or will dissipate less power or both compared to other metal oxide silicon circuits of the same size.

2. The design method of claim 1, wherein said device with a capacitance comprises a metal oxide silicon transistor biased appropriately.

3. The design method of claim 1, wherein said device with a capacitance comprises a capacitor.

4. The design method of claim 1, wherein said metal oxide silicon circuit comprises a complementary metal oxide silicon circuit.

5. The design method of claim 1, wherein said metal oxide silicon circuit comprises a bipolar complementary metal oxide silicon circuit.

6. The design method of claim 1, wherein said metal oxide silicon circuit comprises a pseudo n metal oxide silicon circuit.

7. The design method of claim 1, further including:

optimizing the size of metal oxide silicon transistors which have said device in their input stage.

8. A metal oxide silicon circuit, comprising:

(a) a metal oxide silicon circuit with a capacitive load, (b) a device with a capacitance in series in between the output of said metal oxide silicon circuit and said capacitive load, whereby said metal oxide silicon circuit will operate faster or will dissipate less power or both compared to other metal oxide silicon circuits of the same size.

9. The metal oxide silicon circuit of claim 8, wherein said device with a capacitance comprises a metal oxide silicon transistor biased appropriately.

10. The metal oxide silicon circuit of claim 8, wherein said device with a capacitance comprises a capacitor.

11. The metal oxide silicon circuit of claim 8, wherein said metal oxide silicon circuit comprises a complementary metal oxide silicon circuit.

12. The metal oxide silicon circuit of claim 8, wherein said metal oxide silicon circuit comprises a bipolar complementary metal oxide silicon circuit.

13. The metal oxide silicon circuit of claim 8, wherein said metal oxide silicon circuit comprises a pseudo n metal oxide silicon circuit.

* * * * *